US012412768B2

(12) United States Patent
Choi et al.

(10) Patent No.: US 12,412,768 B2
(45) Date of Patent: Sep. 9, 2025

(54) SEMICONDUCTOR SUBSTRATE PROCESSING APPARATUS

(71) Applicant: Samsung Electronics Co., Ltd., Suwon-si (KR)

(72) Inventors: Jinhyuk Choi, Suwon-si (KR); Kongwoo Lee, Seoul (KR); Beomsoo Hwang, Seoul (KR); Myungki Song, Hwaseong-si (KR); Duckjin Kim, Seongnam-si (KR); Kyusang Lee, Suwon-si (KR); Hyunjoo Jeon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 276 days.

(21) Appl. No.: 18/062,285

(22) Filed: Dec. 6, 2022

(65) Prior Publication Data

US 2023/0230865 A1 Jul. 20, 2023

(30) Foreign Application Priority Data

Jan. 18, 2022 (KR) ........................ 10-2022-0007281

(51) Int. Cl.
*H01L 21/677* (2006.01)
*H01L 21/67* (2006.01)

(52) U.S. Cl.
CPC .. *H01L 21/67742* (2013.01); *H01L 21/67178* (2013.01); *H01L 21/67184* (2013.01); *H01L 21/67201* (2013.01); *H01L 21/67745* (2013.01)

(58) Field of Classification Search
CPC ......... H01L 21/67196; H01L 21/67718; H01L 21/67775; H01L 21/67778;
(Continued)

(56) References Cited

U.S. PATENT DOCUMENTS 5,474,410 A * 12/1995 Ozawa .............. H01L 21/67766
414/217
8,985,937 B2 * 3/2015 Fukutomi ......... H01L 21/67766
414/940
(Continued)

FOREIGN PATENT DOCUMENTS

WO    WO-2020012669 A1 * 1/2020 .......... B25J 11/0095

*Primary Examiner* — Glenn F Myers
(74) *Attorney, Agent, or Firm* — HARNESS, DICKEY & PIERCE, P.L.C

(57) ABSTRACT

A semiconductor substrate processing apparatus includes a substrate transfer module including a chamber having an internal space extending in a first direction within the chamber, at least one pair of first load ports at opposite sides of the chamber, to face in a second direction intersecting the first direction, and configured to rotate and move a substrate carrier, a load lock at a rear surface of the chamber, and a robot arm configured to move in the first direction in the internal space of the chamber, a transfer chamber connected to the load lock of the substrate transfer module, a plurality of processing chambers connected to the transfer chamber, and a transfer arm inside the transfer chamber, and configured to unload the semiconductor substrate from the load lock and to load the semiconductor substrate into at least one of the plurality of processing chambers.

20 Claims, 22 Drawing Sheets

(58) Field of Classification Search
CPC ......... H01L 21/67742; H01L 21/67772; H01L 21/67201; H01L 21/67745; H01L 21/67184; H01L 21/67766
See application file for complete search history.

(56) References Cited

U.S. PATENT DOCUMENTS

| | | | |
|---|---|---|---|
| 9,818,633 B2 | 11/2017 | Lill et al. | |
| 10,559,483 B2 | 2/2020 | Gould et al. | |
| 11,121,015 B2 | 9/2021 | Babbs et al. | |
| 11,121,017 B2 | 9/2021 | Hall et al. | |
| 2002/0192057 A1* | 12/2002 | Meulen | H01L 21/67778 414/217.1 |
| 2003/0091410 A1* | 5/2003 | Larson | H01L 21/67161 414/217 |
| 2003/0194297 A1 | 10/2003 | Sackett et al. | |
| 2015/0013910 A1 | 1/2015 | Krupyshev et al. | |
| 2015/0044001 A1* | 2/2015 | Hofmeister | H01L 21/67201 414/217 |
| 2019/0218041 A1 | 7/2019 | Caveney | |
| 2020/0083071 A1 | 3/2020 | Gould et al. | |
| 2021/0028044 A1* | 1/2021 | Vellore | H01L 21/67383 |
| 2021/0035830 A1* | 2/2021 | Kim | H01L 21/67161 |
| 2021/0272832 A1 | 9/2021 | Burkhart et al. | |

\* cited by examiner

SEMICONDUCTOR SUBSTRATE PROCESSING APPARATUS

CROSS-REFERENCE TO RELATED APPLICATION(S)

This application claims the benefit under 35 U.S.C. 119(a) of Korean Patent Application No. 10-2022-0007281 filed on Jan. 18, 2022 in the Korean Intellectual Property Office, the entire disclosure of which is incorporated herein by reference for all purposes.

BACKGROUND

The present inventive concepts relate to semiconductor substrate processing apparatuses.

A semiconductor substrate processing apparatus may include components for transferring a semiconductor substrate in addition to a plurality of processing chambers in which thin films are stacked on a semiconductor substrate, for example, include a load port on which a substrate carrier in which the semiconductor substrate is accommodated is seated, a robot arm unloading the semiconductor substrate from the substrate carrier, a load lock temporarily accommodating the semiconductor substrate input to the plurality of processing chambers, and the like.

SUMMARY

Example embodiments provide a semiconductor substrate processing apparatus having improved processing efficiency per unit area. By reducing the area occupied by these components, processing efficiency of the semiconductor substrate processing apparatus per unit area may be improved, thereby improving the compactness, efficiency, and performance provided by the semiconductor substrate processing apparatus.

According to some example embodiments, a semiconductor substrate processing apparatus includes a substrate transfer module including a chamber having one or more inner surfaces at least partially defining an internal space extending in a first direction within the chamber, at least one pair of first load ports at opposite sides of the chamber, the at least one pair of first load ports facing in a second direction and configured to rotate and move a substrate carrier to couple the substrate carrier accommodating a semiconductor substrate to the chamber, the second direction intersecting the first direction, a load lock at a rear surface of the chamber to be connected to the internal space of the chamber, and a robot arm configured to move in the first direction in the internal space of the chamber to unload the semiconductor substrate from the substrate carrier and load the semiconductor substrate into the load lock or to unload the semiconductor substrate from the load lock and load the semiconductor substrate into the substrate carrier; a transfer chamber connected to the load lock of the substrate transfer module; a plurality of processing chambers connected to the transfer chamber; and a transfer arm inside the transfer chamber, and configured to unload the semiconductor substrate from the load lock and to load the semiconductor substrate into at least one processing chamber of the plurality of processing chambers.

According to some example embodiments, a semiconductor substrate processing apparatus includes a substrate transfer module including a chamber having one or more inner surfaces at least partially defining an internal space extending in a first direction within the chamber, at least one pair of load ports at opposite sides of the chamber, the at least one pair of first load ports facing in a second direction, intersecting the first direction, at least one pair of substrate aligners and at least one pair of buffer devices on opposite side portions of the internal space to overlap the at least one pair of load ports in the first direction, and a robot arm configured to move in the first direction in the internal space of the chamber and configured to transfer a semiconductor substrate to the at least one pair of load ports, the at least one pair of substrate aligners and the at least one pair of buffer devices; a transfer chamber connected to the substrate transfer module; a plurality of processing chambers connected to the transfer chamber; and a transfer arm inside the transfer chamber and configured to load the semiconductor substrate into at least one of the plurality of processing chambers.

According to some example embodiments, a semiconductor substrate processing apparatus includes a substrate transfer module including a chamber having a front surface and a rear surface opposing each other, at least one pair of load ports at opposite sides of the chamber, at least one pair of buffer devices in the chamber to overlap the at least one pair of load ports in a vertical direction, a load lock on the rear surface of the chamber, and a robot arm configured to move in the vertical direction in the chamber and configured to transfer a semiconductor substrate to the at least one pair of load ports, the at least one pair of buffer devices, and the load lock. The front surface of the chamber includes an entrance configured to enable the robot arm and the at least one pair of buffer devices to be loaded and unloaded through the entrance.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1A:
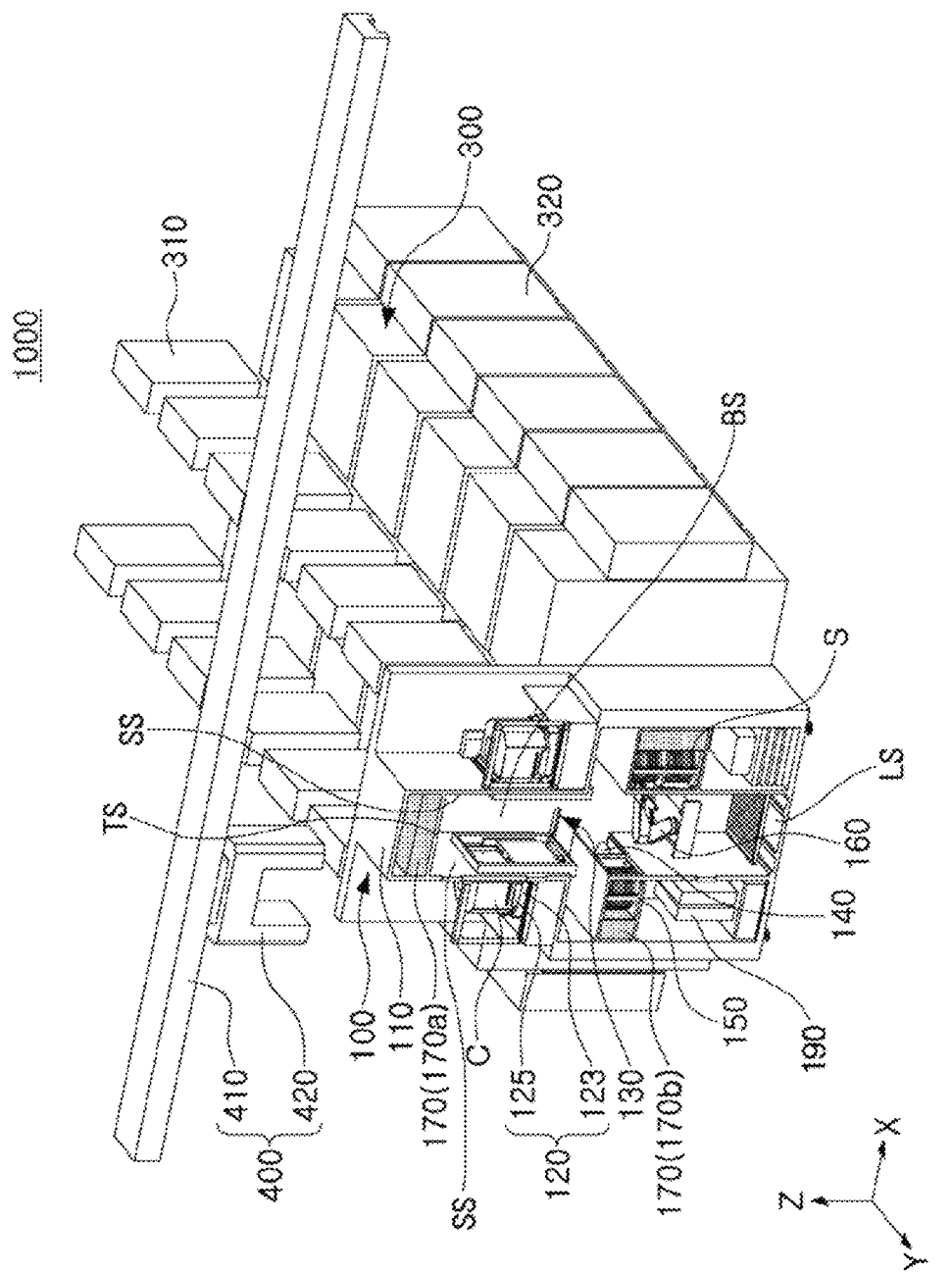
FIG. 1A is a perspective view illustrating a semiconductor substrate processing apparatus according to some example embodiments.

Hereinafter, some example embodiments will be described in detail with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., +10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

Figure 1B:
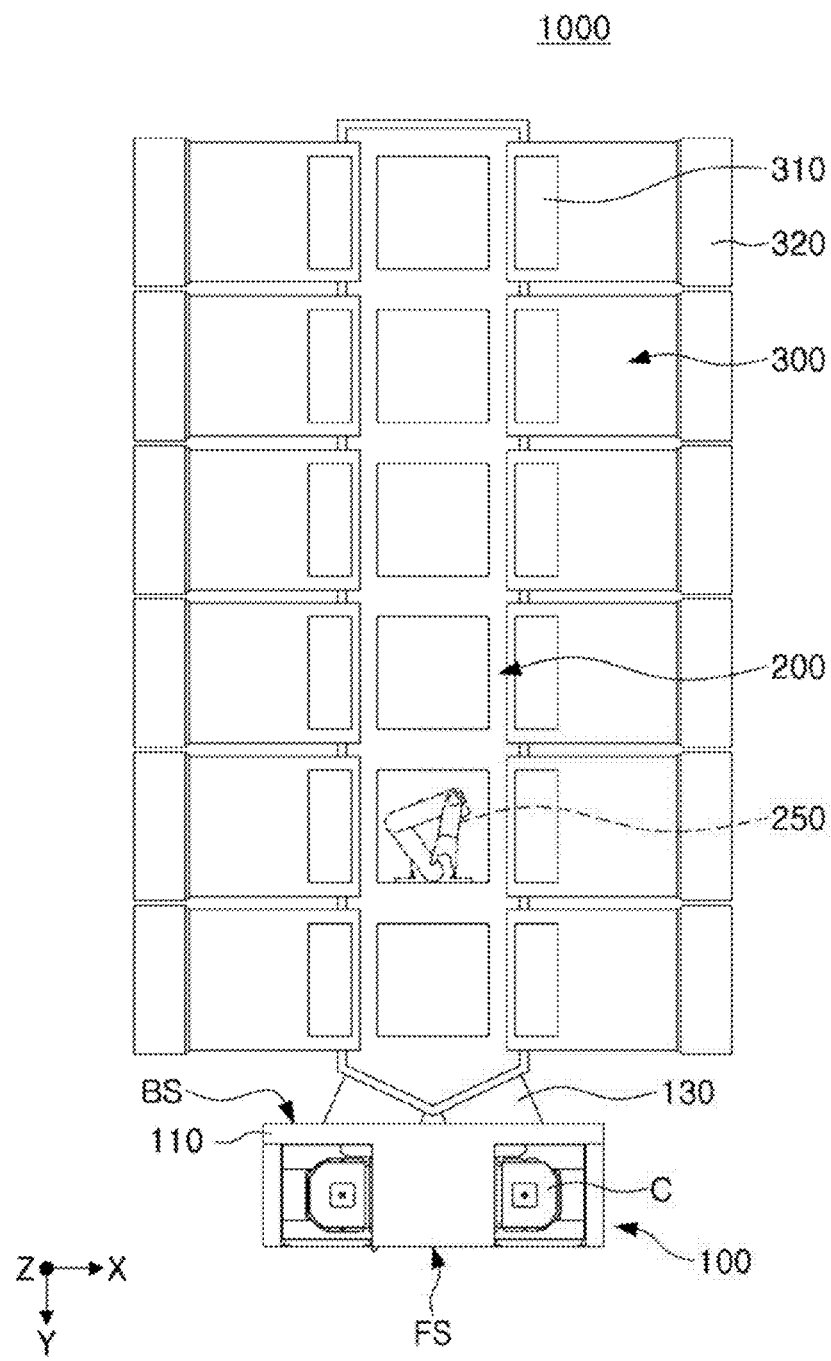
FIG. 1B is a plan view of the semiconductor substrate processing apparatus of FIG. 1A according to some example embodiments.
Figure 1C:
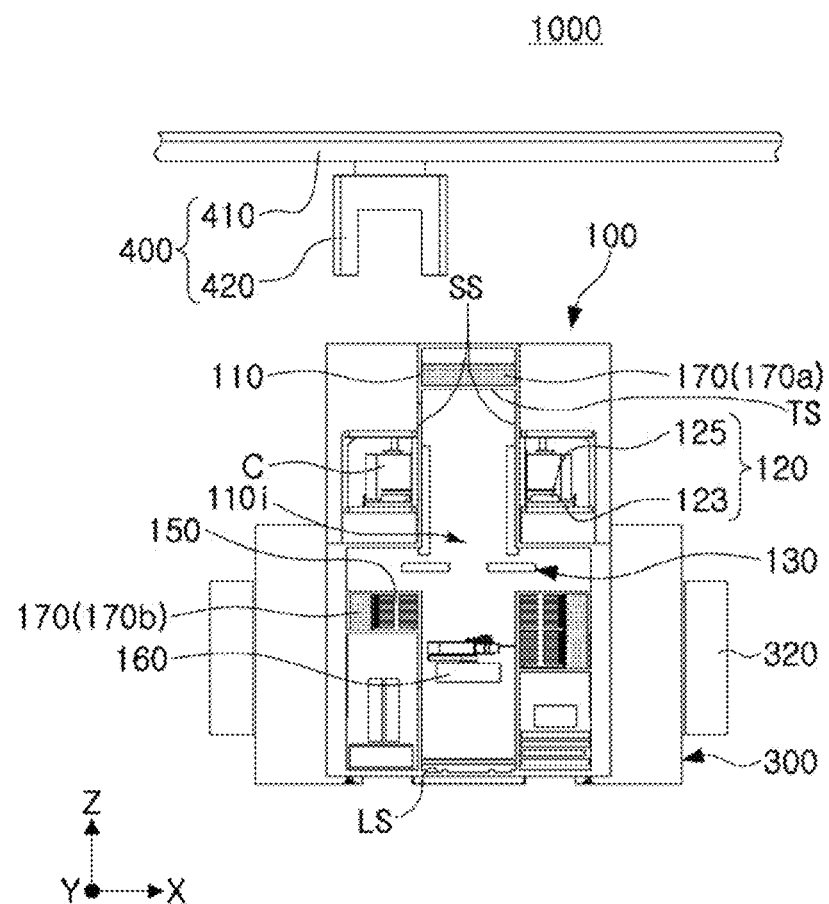
FIG. 1C is a front view of the semiconductor substrate processing apparatus of FIG. 1A according to some example embodiments.

FIG. 1A is a perspective view illustrating a semiconductor substrate processing apparatus 1000 according to some example embodiments, FIG. 1B is a plan view of the semiconductor substrate processing apparatus 1000 of FIG. 1A according to some example embodiments, and FIG. 1C is a front view of the semiconductor substrate processing apparatus 1000 of FIG. 1A according to some example embodiments.

Referring to FIGS. 1A to 1C, the semiconductor substrate processing apparatus 1000 according to some example embodiments may include a substrate transfer module 100, a transfer chamber 200, a transfer arm 250, and a processing chamber 300.

The substrate transfer module 100 may include a chamber 110, a load port 120, a load lock 130, a substrate aligner 140, a buffer device 150, a robot arm 160, and an air supply device 170. The substrate transfer module 100 may be configured to unload a semiconductor substrate S to be provided in the process from a substrate carrier C, to align the semiconductor substrate S and transfer the semiconductor substrate to the transfer chamber 200. In addition, the substrate transfer module 100 may be configured to receive the semiconductor substrate S having been completed in the process from the transfer chamber 200, temporarily store the semiconductor substrate S, and load the semiconductor substrate S into the substrate carrier C. According to some example embodiments, the load port 120 is stacked on the chamber 110, and the robot arm 160 for transferring the semiconductor substrate S is configured to move in the vertical direction (Z-direction) within the chamber 110, thereby reducing an installation area (e.g., an area occupied in the X-Y plane) of the substrate transfer module 100 and improving processing efficiency of the semiconductor substrate processing apparatus 1000 per unit area, thereby improving the compactness, efficiency, and performance provided by the semiconductor substrate processing apparatus 1000.

The chamber 110 may have a front surface FS and a rear surface BS opposing each other and may include side surfaces SS opposing each other and may include a top surface TS, and an internal space (also described herein as internal space 110i as shown in at least FIGS. 1B and 1C) extending in the first direction (Z-direction). The chamber 110 may be understood to be a structure having one or more inner surfaces that at least partially define the internal space 110i extending in the first direction (Z-direction), where the one or more inner surfaces may include one or more of the front surface FS, the rear surface BS, one or more of the side surfaces SS, the lower surface LS, any combination thereof, or the like. The internal space of the chamber 110 may provide a movement path of the semiconductor substrate S which is unloaded from the substrate carrier C in a vertical direction (e.g., Z-direction) and a horizontal direction (e.g., a direction in which the X-Y plane extends). In addition, the internal space of the chamber 110 may provide a space in which the substrate aligner 140, the buffer device 150, the robot arm 160, the air supply device 170, and the like are disposed. In addition, a control module 190 for controlling driving of the load port 120, the substrate aligner 140, and the robot arm 160, controlling any part of the semiconductor substrate processing apparatus 1000, any combination thereof, or the like, may be disposed inside the chamber 110. In the drawing, the control module 190 is disposed below the buffer device 150, but the configuration is not limited thereto.

As described herein, any apparatuses, devices, systems, blocks, modules, units, controllers, circuits, apparatus, and/or portions thereof according to any of some example embodiments (including, without limitation, any of the example embodiments of the semiconductor substrate processing apparatus 1000, control module 190, semiconductor substrate processing apparatus 1000A, semiconductor substrate processing apparatus 1000B, semiconductor substrate processing apparatus 1000C, semiconductor substrate processing apparatus 1, semiconductor substrate processing apparatus 1', semiconductor substrate processing apparatus 1000a, semiconductor substrate processing apparatus 1000b, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any apparatuses, devices, systems, blocks, modules, units, controllers, circuits, apparatuses, and/or portions thereof according to any of some example embodiments, and/or any portions thereof, including for example some or all operations of any of the methods and/or processes shown in any of the drawings.

The load port 120 may be configured to support and move the substrate carrier C accommodating the semiconductor substrate S to be coupled to the chamber 110. To couple the substrate carrier C to the chamber 110, the load port 120 may be configured to move the substrate carrier C in the horizontal direction (e.g., X-direction) or rotate the substrate carrier C about an axis in the vertical direction (e.g., Z-direction). As an example, the load port 120 may include a transfer rail 123 extending towards the chamber 110, and a transfer tray 125 configured to move along the transfer rail 123 and rotate about an axis extending in the first direction (Z-direction). The load port 120 may rotate the substrate carrier C so that a door of the substrate carrier C mounted on the transfer tray 125 faces the chamber 110. The door of the substrate carrier C may be opened and closed by being coupled to a gate of one side of the chamber 110.

The load ports 120 may be respectively disposed on both sides (e.g., opposite sides) of the chamber 110. For example, the load port 120 may include at least a pair of load ports 120 respectively disposed on both sides (e.g., opposite sides) of the chamber 110 to face in the second direction (X-direction) intersecting the first direction (Z-direction) (e.g., to face each other in the second direction). In addition, the load port 120 may be disposed to overlap at least a portion of the chamber 110. For example, the load port 120 may be disposed adjacent to a side surface between the front surface FS and the rear surface BS of the chamber 110, and may overlap at least a portion of the chamber 110 in the vertical direction (e.g., Z-direction). In this case, the substrate aligner 140 and/or the buffer device 150 may be disposed in the internal space of the chamber 110 overlapping the load port 120, and the robot arm 160 may be configured to move in a vertical direction (e.g., Z-direction) in the internal space of the chamber 110 to load or unload the semiconductor substrate S into the load port 120, the substrate aligner 140 and the buffer device 150. According to some example embodiments, since the load port 120 is not disposed on the front surface FS of the chamber 110, the area of the substrate transfer module 100 (e.g., area in the X-Y plane) may be reduced, and processing efficiency per unit area of the semiconductor substrate processing apparatus 1000 may be improved, thereby improving the compactness, efficiency, and performance provided by the semiconductor substrate processing apparatus 1000.

The load lock 130 may be disposed on the rear surface BS of the chamber 110 to be connected to (e.g., exposed to, open to, etc.) the internal space of the chamber 110. The load lock 130 may spatially connect the chamber 110 and the transfer chamber 200. For example, the load lock 130 may be configured to receive the semiconductor substrate S transferred from the substrate transfer module 100 to the transfer chamber 200 or transferred from the transfer chamber 200 to the substrate transfer module 100, and to temporarily store the semiconductor substrate S. In addition, a gate (not illustrated) that allows or blocks the entry and exit of the semiconductor substrate S may be disposed between the load lock 130 and the chamber 110, and a gate (not illustrated) for allowing or blocking the entry and exit of the semiconductor substrate S may be disposed between the load lock 130 and the transfer chamber 200. The load lock 130 may include a loading load lock and an unloading load lock. However, according to some example embodiments, the number of load locks 130 may be variously changed, for example, the load lock 130 may be provided as only one load lock.

The load lock 130 may be configured to control a pressure of an internal region inside the load lock 130 and in which the semiconductor substrate S is accommodated. For example, the load lock 130 may include one or more inner surfaces at least partially defining an internal region inside the load lock 130, the load lock 130 may be configured to accommodate the semiconductor substrate S within the internal region, and the load lock 130 may be configured to control a pressure of the internal region. For example, when the semiconductor substrate S is transferred to and from the transfer chamber 200, the pressure inside the load lock 130 may be controlled to have substantially the same vacuum pressure as that of the transfer chamber 200. Also, when the semiconductor substrate S is transferred to and from the substrate transfer module 100, the pressure inside the load lock 130 may be controlled to have substantially the same atmospheric pressure as that of the transfer chamber 200.

The load lock 130 may function as a cooling chamber for cooling the temporarily stored semiconductor substrate S.

The substrate aligner 140 may be disposed in the internal space of the chamber 110 to align the semiconductor substrate S. For example, the substrate aligner 140 may include at least one pair of substrate aligners 140 respectively disposed on both sides of the internal space of the chamber 110 to overlap with at least one of the at least one pair of load ports 120 in the first direction (Z-direction). The substrate aligner 140 may include a spinner that rotates the semiconductor substrate S so that the semiconductor substrate S faces a preset direction. For example, the substrate aligner 140 may be configured to sense a notch formed in the semiconductor substrate S and rotate the semiconductor substrate S based on the sensed position of the notch. The position of the substrate aligner 140 is not particularly limited, but may be disposed adjacent to the buffer device 150 in consideration of the movement path of the robot arm 160.

The buffer device 150 may be disposed in the internal space of the chamber 110 and configured to temporarily store the semiconductor substrate S. For example, the buffer device 150 may include at least one pair of buffer devices 150 respectively disposed on both sides of the internal space of the chamber 110 so as to overlap with at least one of the at least one pair of load ports 120 in the first direction (Z-direction). For example, the robot arm 160 may be configured to unload the semiconductor substrate S from the at least one pair of buffer devices 150 and load the semiconductor substrate S into the load lock 130, or to unload the semiconductor substrate S from the load lock 130 and load the semiconductor substrate S into at least one pair of buffer devices 150.

In the internal space of the chamber 110, the robot arm 160 may be configured to transfer the semiconductor substrate S to at least one pair of load ports 120, at least one pair of substrate aligners 140, and at least one pair of buffer devices 150. For example, the robot arm 160 may be configured to move in the first direction (Z-direction), and to unload the semiconductor substrate S from the substrate carrier C mounted on the load port 120 and load the semiconductor substrate S into the substrate aligner 140, the buffer device 150, or the load lock 130, or to unload the semiconductor substrate S from the load lock 130 and load the semiconductor substrate S into the buffer device 150 or the substrate carrier C. The robot arm 160 may be configured to move inside the chamber 110 along a guide rail extending in the first direction (Z-direction).

The air supply device 170 may be disposed in the internal space of the chamber 110 and may be configured to purify the internal space of the chamber 110. The air supply device 170 may include a fan-filter unit (FFU) including a fan, an intake duct, an exhaust duct, a filter, and the like. In addition, the air supply device 170 may be configured to control the humidity inside the chamber 110. As an example, the air supply device 170 may include a first air supply device 170a disposed in the upper portion of the internal space of the chamber 110 and configured to supply air in the vertical direction (Z-direction) to the internal space, and a second air supply device 170b disposed in the side of the internal space of the chamber 110 (e.g., one side of the substrate aligner 140 and/or one side of the buffer device 150), and suppling air to the internal space in a horizontal direction (X-direction). The air supply device 170 may form an airflow in a vertical direction (Z-direction) or/and a horizontal direction (X-direction) to reduce particle adhesion on the semiconductor substrate S.

The transfer chamber 200 may be configured to transfer the semiconductor substrate S, between the substrate transfer module 100 and the processing chamber 300. The transfer chamber 200 may be connected to the load lock 130 of the substrate transfer module 100. The transfer chamber 200 may be spatially connected to the substrate transfer module 100 (or the load lock 130) and the processing chamber 300. The transfer chamber 200 may thus be configured to establish spatial communication between the substrate transfer module 100 and the processing chamber 300 and enable transfer of the semiconductor substrate S between the substrate transfer module 100 and the processing chamber 300. For example, the transfer chamber 200 may be configured to transfer the semiconductor substrate S received from the substrate transfer module 100 to the processing chamber 300, or to transfer the semiconductor substrate S received from the processing chamber 300 to the substrate transfer module 100. Between the transfer chamber 200 and the substrate transfer module 100 (or the load lock 130), a gate (not illustrated) that allows or blocks the entry and exit of the semiconductor substrate S may be disposed, and a gate (not illustrated) for allowing or blocking the entry and exit of the semiconductor substrate S may be disposed between the transfer chamber 200 and the processing chamber 300. The transfer arm 250 configured to load or unload the semiconductor substrate S when the gate (not illustrated) is opened may be disposed inside the transfer chamber 200. The pressure inside the transfer chamber 200 may be controlled to have substantially the same vacuum pressure as that of the processing chamber 300.

The transfer arm 250 may be disposed inside the transfer chamber 200 and configured to unload the semiconductor substrate S from the substrate transfer module 100 (or the load lock 130) and load the semiconductor substrate S into at least one of the plurality of processing chambers 300. For example, the transfer arm 250 may be configured to move in the horizontal direction (the direction in which the X-Y plane extends) inside the transfer chamber 200, to unload the semiconductor substrate S from the substrate transfer module 100 (or the load lock 130) and load the semiconductor substrates S into the processing chamber 300, or to unload the semiconductor substrate S having been completed in the process from the processing chamber 300 and load the semiconductor substrates S into the substrate transfer module 100 (or the load lock 130). The transfer arm 250 may be a robot arm configured to handle the semiconductor substrate S in a vacuum state.

The processing chamber 300 may be an apparatus for processing the semiconductor substrate S received from the transfer chamber 200. The processing chamber 300 may be provided as a plurality of processing chambers 300 connected to the transfer chamber 200. The processing chamber 300 may include a deposition chamber, such as, for example, a Chemical Vapor Deposition (CVD) chamber, a Physical Vapor Deposition (PVD) chamber and an Atomic Layer Deposition (ALD) chamber, an oxidation chamber, a thermal treatment chamber, a cleaning chamber, an etch chamber, and the like. For example, a first processing box 310 may be disposed in an upper portion of the processing chamber 300. The first processing box 310 may store components or gases for plasma processing. In addition, second processing boxes 320 may be disposed in a lower portion of the processing chamber 300. The second processing boxes 320 may accommodate components for processing the semiconductor substrate S in the processing chamber 300, for example, plasma equipment.

On the other hand, a carrier transfer apparatus 400 may be disposed on the substrate transfer module 100. The carrier transfer apparatus 400 may be configured to transport the substrate carrier C. For example, the carrier transfer apparatus 400 may transfer the substrate carrier C in which the semiconductor substrate S to be provided to the process is accommodated to the substrate transfer module 100, or may receive the substrate carrier C in which the process-completed semiconductor substrate S is accommodated, from the substrate transfer module 100, and transfer the same to an apparatus for a subsequent process. The substrate carrier C may include a front opening unified pod (FOUP) that accommodates a plurality of semiconductor substrates S (e.g., a semiconductor wafer).

The carrier transfer apparatus 400 may include a carrier transfer line 410 and a carrier transfer robot 420. The carrier transfer line 410 may be disposed above the substrate transfer module 100 and provide a horizontal movement path of the carrier transfer robot 420. For example, the carrier transfer line 410 may extend in a horizontal direction (e.g., a direction in which the X-Y plane extends) above the substrate transfer module 100.

The carrier transfer robot 420 may move the substrate carrier C along a path provided by the carrier transfer line 410. In addition, the carrier transfer robot 420 may be configured to move in the vertical direction to provide the substrate carrier C to the load port 120 of the substrate transfer module 100 or to pick up the substrate carrier C from the load port 120. The carrier transfer robot 420 may be a robot arm configured to grip the substrate carrier C.

Figure 2:
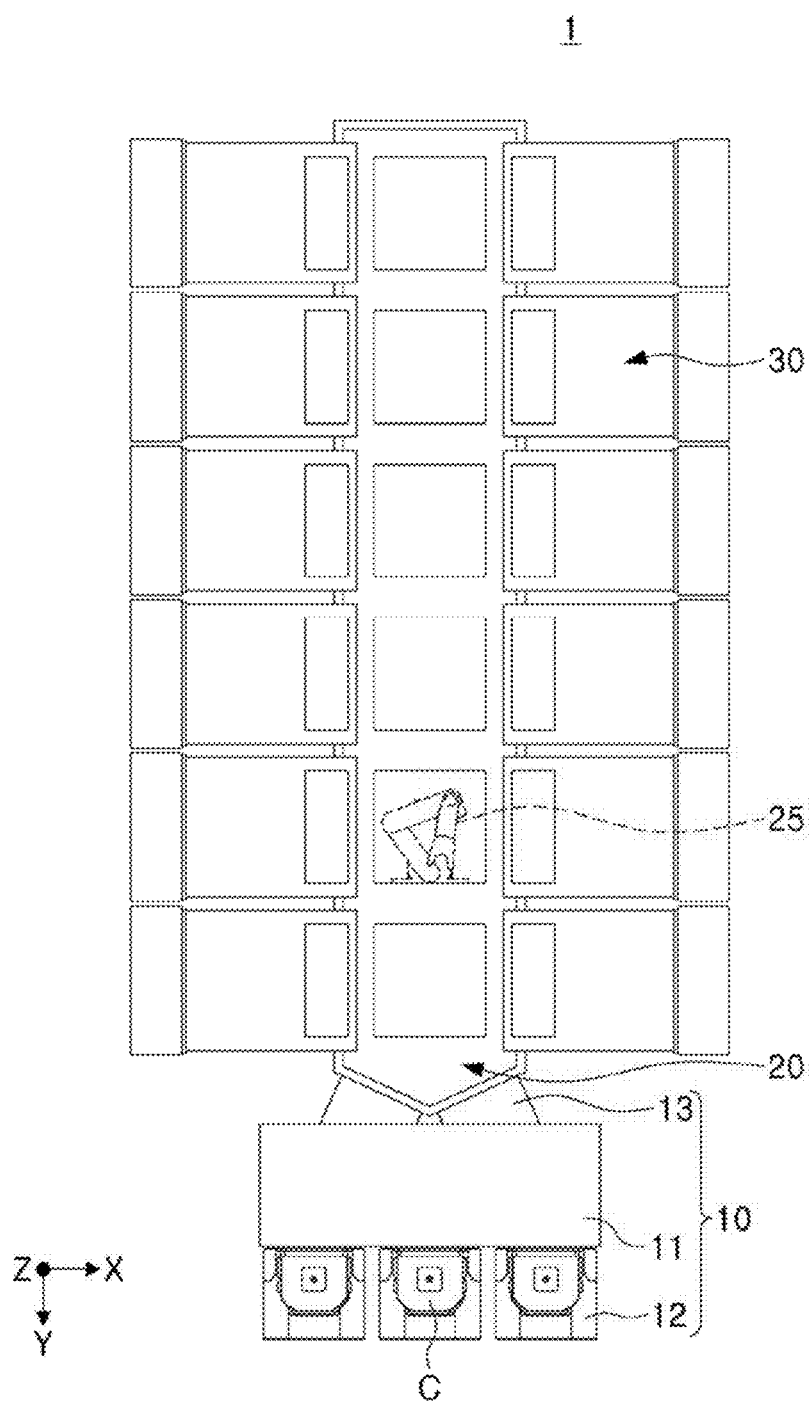
FIG. 2 is a plan view illustrating a semiconductor substrate processing apparatus according to some example embodiments.

FIG. 2 is a plan view illustrating a semiconductor substrate processing apparatus 1 according to some example embodiments. FIG. 2 illustrates a planar shape of the semiconductor substrate processing apparatus 1 corresponding to FIG. 1B.

Referring to FIG. 2, the semiconductor substrate processing apparatus 1 of some example embodiments may include a substrate transfer module 10 including a chamber 11, a load port 12 and a load lock 13, a transfer chamber 20, a transfer arm 25, and a processing chamber 30. In this case, the load port 12 may be disposed so as not to overlap the chamber 11 in the vertical direction (Z-direction). For example, the load port 12 may be disposed on the front surface FS of the chamber 11, and the load lock 13 may be disposed on the rear surface BS of the chamber 11. Accordingly, the Y-direction length of the semiconductor substrate processing apparatus 1 of some example embodiments may be greater than the Y-direction length of the semiconductor substrate processing apparatus 1000 of some example embodiments, including the example embodiments described with reference to FIGS. 1A to 1C. Also, the semiconductor substrate processing apparatus 1 of some example embodiments may have a larger installation area than the semiconductor substrate processing apparatus 1000 of some example embodiments. In this case, the "installation area" may be understood as an area occupied by the semiconductor substrate processing apparatus 1000 in the X-Y plane. As a result, compared with the semiconductor substrate processing apparatus 1 of some example embodiments, the processing efficiency of the semiconductor substrate processing apparatus 1000 per unit area in some example embodiments may be improved, thereby improving the compactness, efficiency, and performance provided by the semiconductor substrate processing apparatus 1000.

Figure 3A:
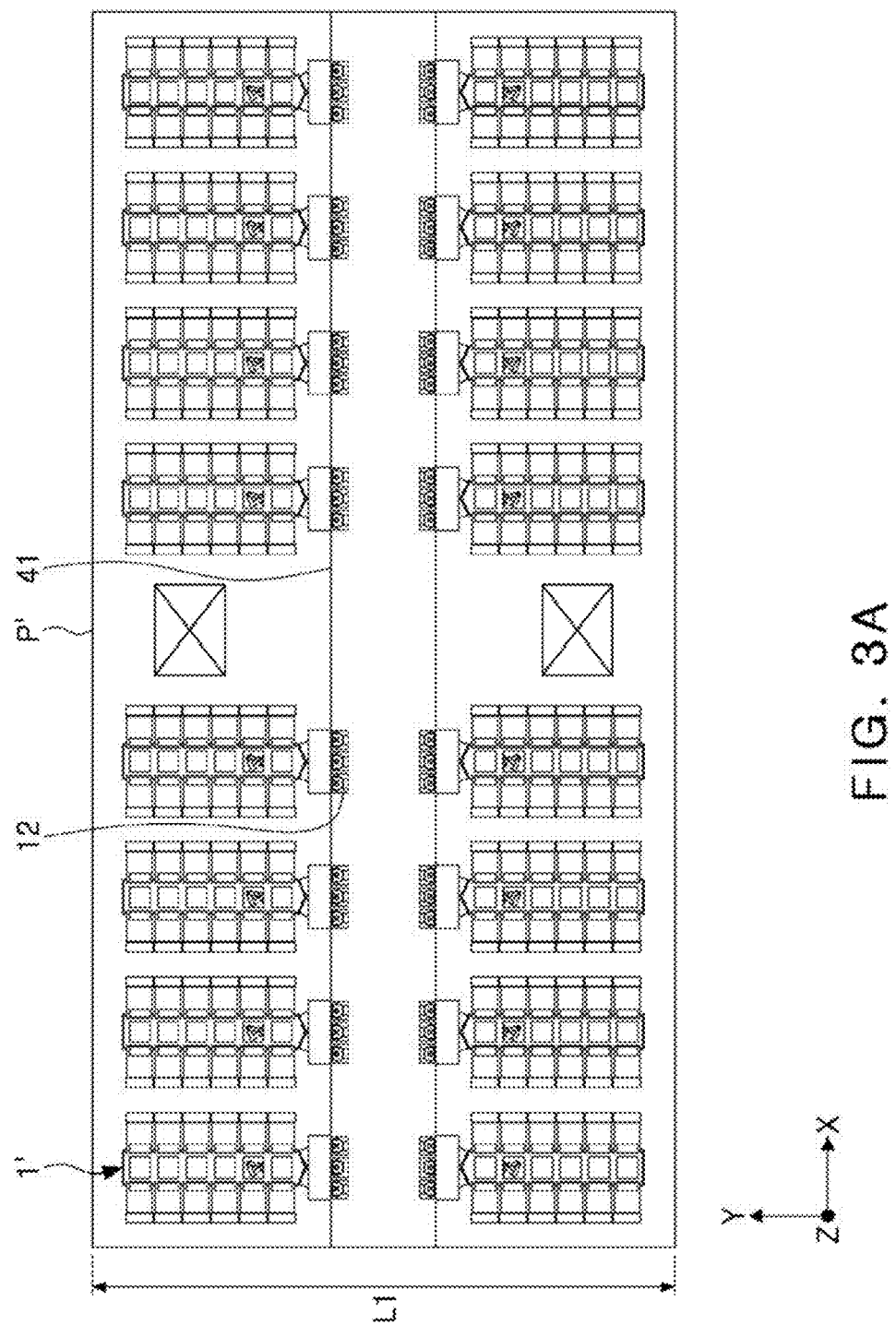
FIG. 3A is a plan view illustrating a processing chamber in which semiconductor substrate processing apparatuses of some example embodiments are disposed.
Figure 3B:
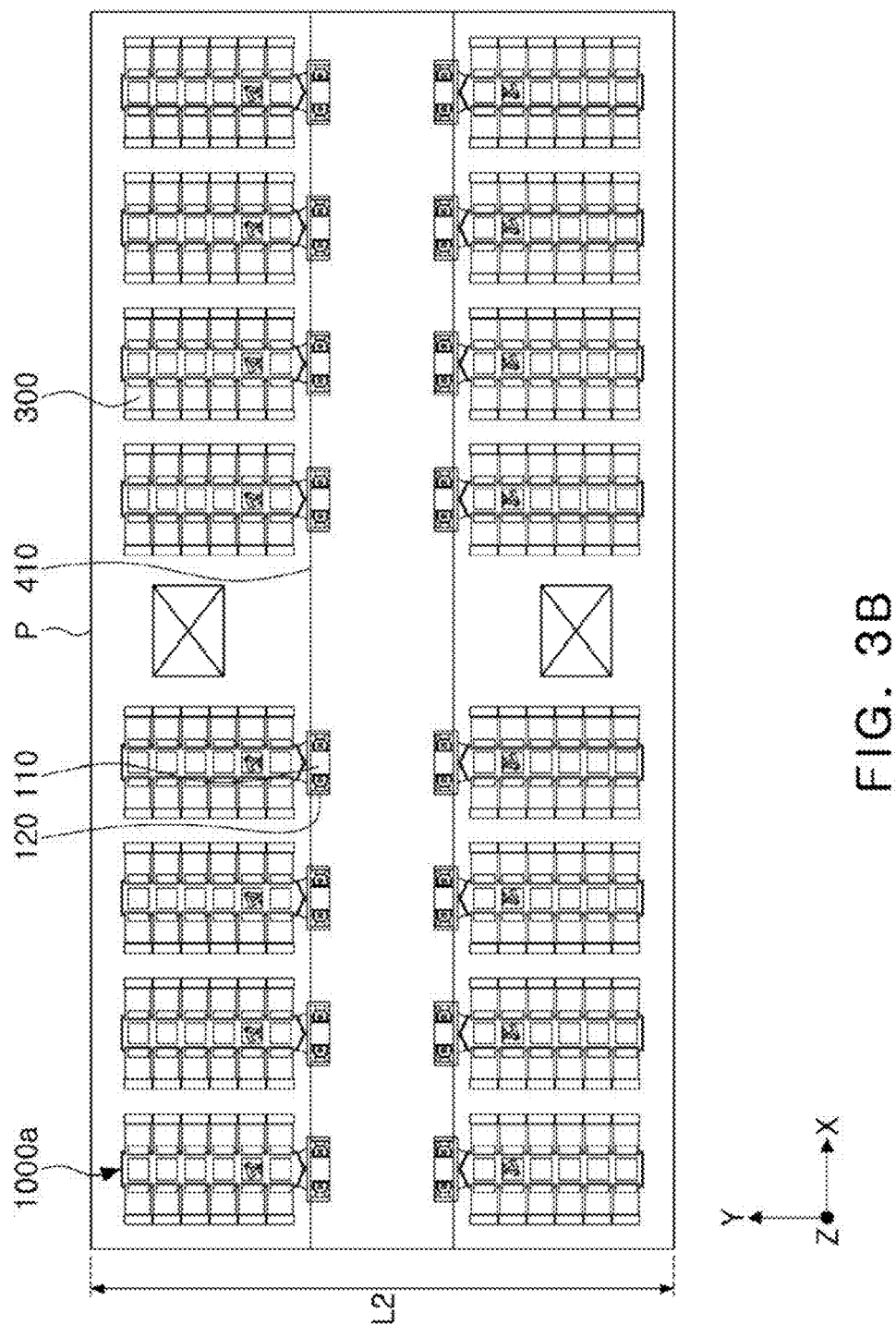
FIGS. 3B and 3C are plan views each illustrating a processing chamber in which semiconductor substrate processing apparatuses according to some example embodiments are disposed.
Figure 3C:
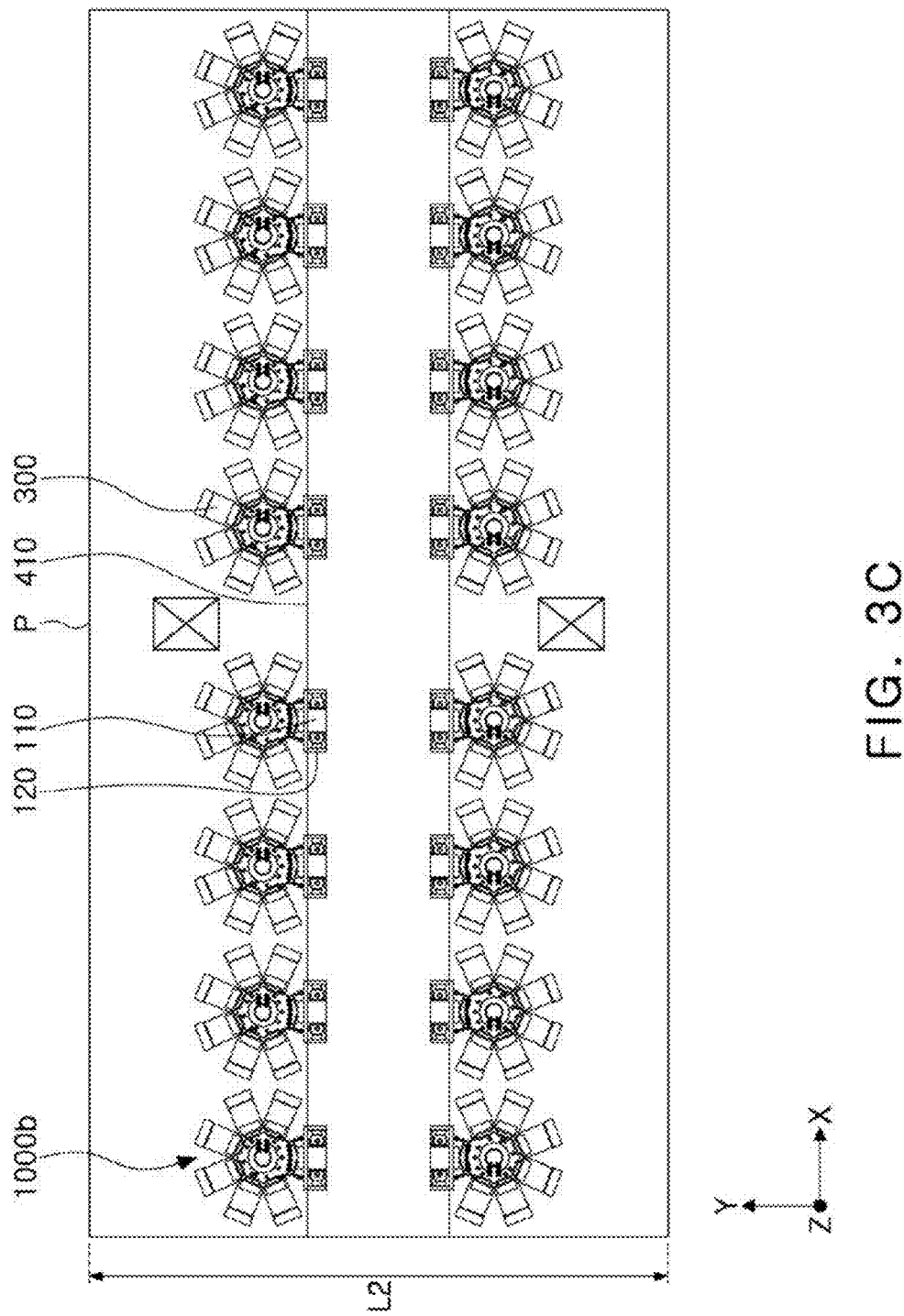

FIG. 3A is a plan view illustrating a processing room P' in which the semiconductor substrate processing apparatuses 1 of some example embodiments are disposed, and FIGS. 3B and 3C are plan views illustrating a processing room P in which semiconductor substrate processing apparatuses 1000a and 1000b according to some example embodiments are disposed.

Referring to FIG. 3A, the processing room P' may accommodate a plurality of semiconductor substrate processing apparatuses 1' according to some example embodiments. The plurality of semiconductor substrate processing apparatuses 1' may be disposed to be spaced apart from each other in consideration of accessibility for maintenance or the like. For example, on the X-Y plane, the plurality of semiconductor substrate processing apparatuses 1' may be disposed in the form of a matrix including a row (e.g., '2 rows') of M that is an integer of 1 or more and a column (e.g., '8 columns') of N that is an integer of 1 or more. Also, the plurality of semiconductor substrate processing apparatuses 1' may be disposed such that the load ports 12 are aligned on the carrier transfer line 41. For example, when the carrier transfer line 41 extends in the X-direction, the plurality of semiconductor substrate processing apparatuses 1' may be disposed to face each other in the Y-direction. In this case, the processing room P' may have a first width L1 in the Y-direction in consideration of the separation distance between the plurality of semiconductor substrate processing apparatuses 1'.

FIG. 3B illustrates an inline type semiconductor substrate processing apparatus 1000a in which processing chambers 300 are arranged along both sides of the transfer chamber 200, and FIG. 3C illustrates a cluster type semiconductor substrate processing apparatus 1000b in which processing chambers 300 are arranged to surround the transfer chamber 200.

Referring to FIGS. 3B and 3C, the processing room P may accommodate a plurality of the semiconductor substrate processing apparatuses 1000a and 1000b according to some example embodiments. The plurality of semiconductor substrate processing apparatuses 1000a and 1000b may be disposed to be spaced apart from each other in consideration of accessibility for maintenance or the like. For example, on the X-Y plane, the plurality of semiconductor substrate processing apparatuses 1000a and 1000b may be disposed in the form of a matrix including a row (e.g., '2 rows') of M that is an integer of 1 or more and a column (e.g., '8 columns') of N that is an integer of 1 or more. Also, the plurality of semiconductor substrate processing apparatuses 1000a and 1000b may be disposed such that the load ports 120 are aligned on the carrier transfer line 410. For example, when the carrier transfer line 410 extends in the X-direction, the plurality of semiconductor substrate processing apparatuses 1000a and 1000b may be disposed to face each other in the Y-direction. In this case, the processing room P may have a second width L2 in the Y-direction in consideration of the separation distance between the plurality of semiconductor substrate processing apparatuses 1000.

In example embodiments, since the load ports 120 are disposed on both sides of the chamber 110 and at least some of the load ports 120 are disposed to overlap the chamber 110 in the vertical direction (Z-direction), the length of the plurality of semiconductor substrate processing apparatuses 1000a and 1000b may be reduced in the Y-direction than that of the semiconductor substrate processing apparatuses 1' of FIG. 3A. Accordingly, the installation area of the semiconductor substrate processing apparatuses 1000a and 1000b in some example embodiments may be smaller than the installation area of the semiconductor substrate processing apparatuses 1' of some example embodiments. Also, the second width L2 of the processing room P of some example embodiments may be shorter than the first width L1 of the processing room P' of some example embodiments. On the other hand, unlike illustrated in the drawing, depending on the size of the processing room P, the semiconductor substrate processing apparatuses 1000a and 1000b according to some example embodiments may be disposed in greater number than the number of the semiconductor substrate processing apparatuses 1' of some example embodiments. As such, the semiconductor substrate processing apparatuses 1000a and 1000b according to some example embodiments may provide the processing room P having superior processing efficiency per unit area than the semiconductor substrate processing apparatuses 1' of some example embodiments.

Figure 4:
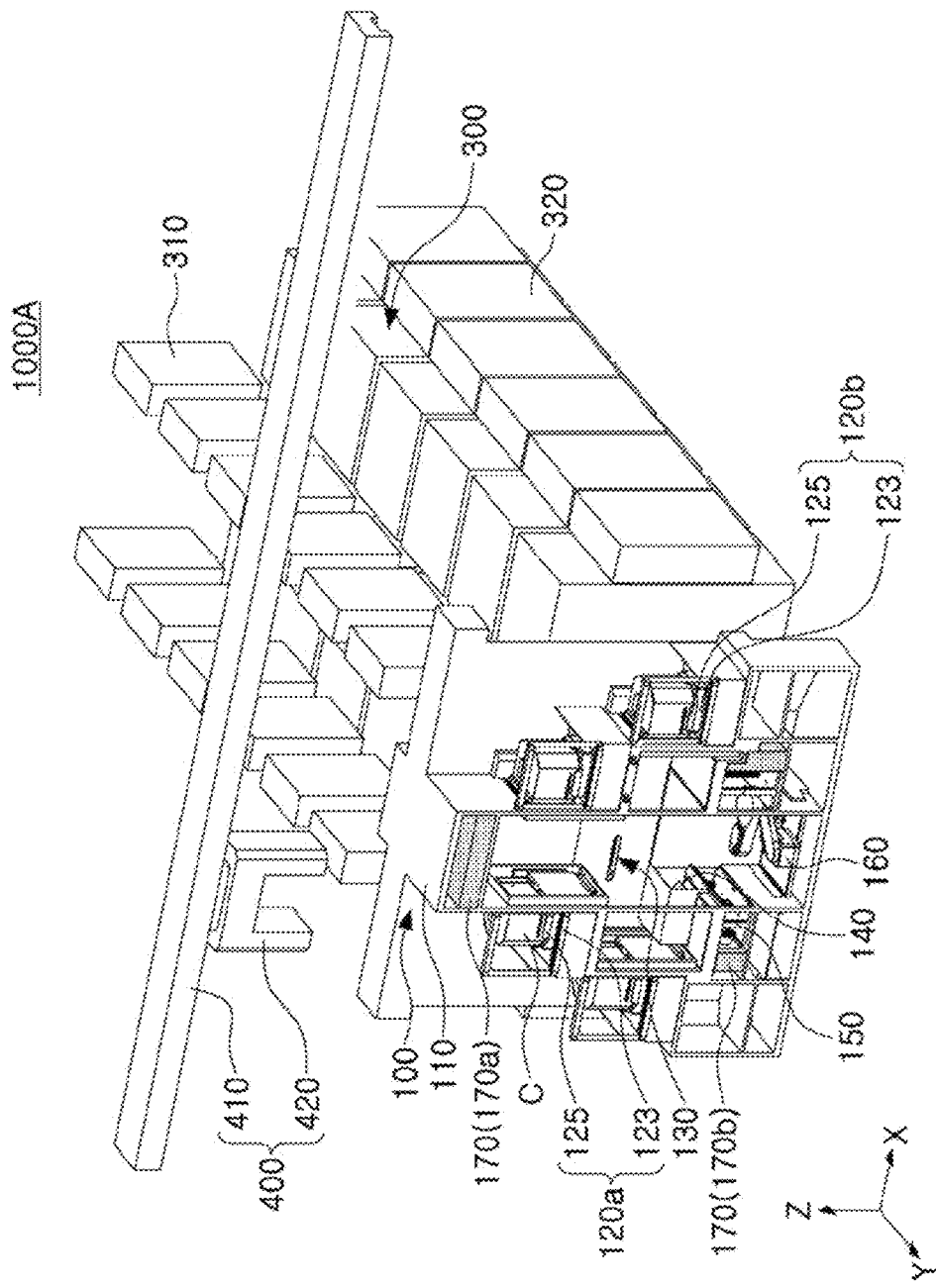
FIG. 4 is a perspective view illustrating a semiconductor substrate processing apparatus according to some example embodiments.

FIG. 4 is a perspective view illustrating a semiconductor substrate processing apparatus 1000A according to some example embodiments.

Referring to FIG. 4, the semiconductor substrate processing apparatus 1000A according to some example embodiments may further include a second load port 120b staggered from the first load port 120a. The second load port 120b may be disposed staggered from the first load port 120a to load and unload the substrate carrier C in the vertical direction (Z-direction). For example, the semiconductor substrate processing apparatus 1000A of some example embodiments may include at least one pair of first load ports 120a respectively disposed on both sides of the chamber 110 to face each other in the second direction (X-direction), and at least one pair of second load ports 120b respectively disposed on both sides of the chamber 110 so as not to overlap the at least one pair of first load ports 120a in the first direction (Z-direction). According to some example embodiments, without an increase in the Y-direction length of the semiconductor substrate processing apparatus 1000A, four or more substrate carriers C may be mounted, and the processing efficiency of the semiconductor substrate processing apparatus 1000A per unit area may be further improved. Since the semiconductor substrate processing apparatus 1000A of some example embodiments has the same or similar characteristics as those described with reference to FIGS. 1A to 1C, overlapping descriptions will be omitted.

FIGS. 5A, 5B, 5C, 5D, and 5E are front views illustrating a process of processing a semiconductor substrate using a semiconductor substrate processing apparatus according to some example embodiments. FIGS. 5A to 5E illustrate a process of unloading the semiconductor substrate S from the substrate carrier C and loading the semiconductor substrate S into the load lock 130 in sequence.

Figure 5A:
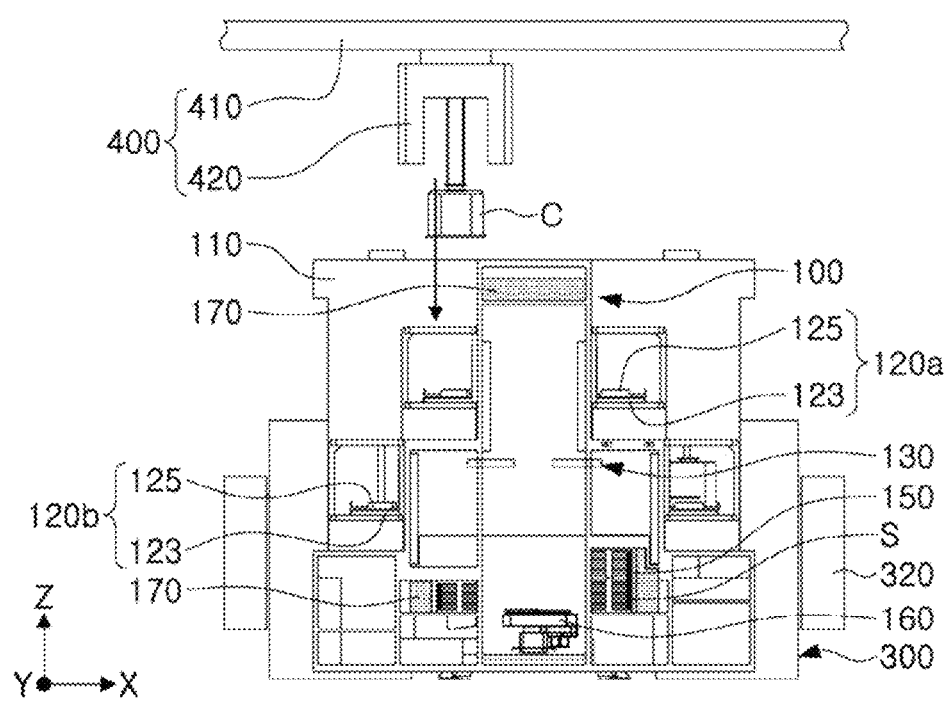
FIGS. 5A, 5B, 5C, 5D, and 5E are front views illustrating a process of processing a semiconductor substrate using an apparatus for processing a semiconductor substrate according to some example embodiments.

Referring to FIG. 5A, first, the substrate carrier C may be mounted on at least one of the plurality of load ports 120a and 120b. For example, the carrier transfer robot 420 moves in the horizontal direction (the direction in which the X-Y plane extends) and the vertical direction (the Z-direction), and may mount the substrate carrier C on at least one of the first load port 120a and the second load port 120b. The remaining part of the first load port 120a and the second load port 120b may be in a state in which the substrate carrier C on which the semiconductor substrate is loaded or unloaded is mounted.

Figure 5B:
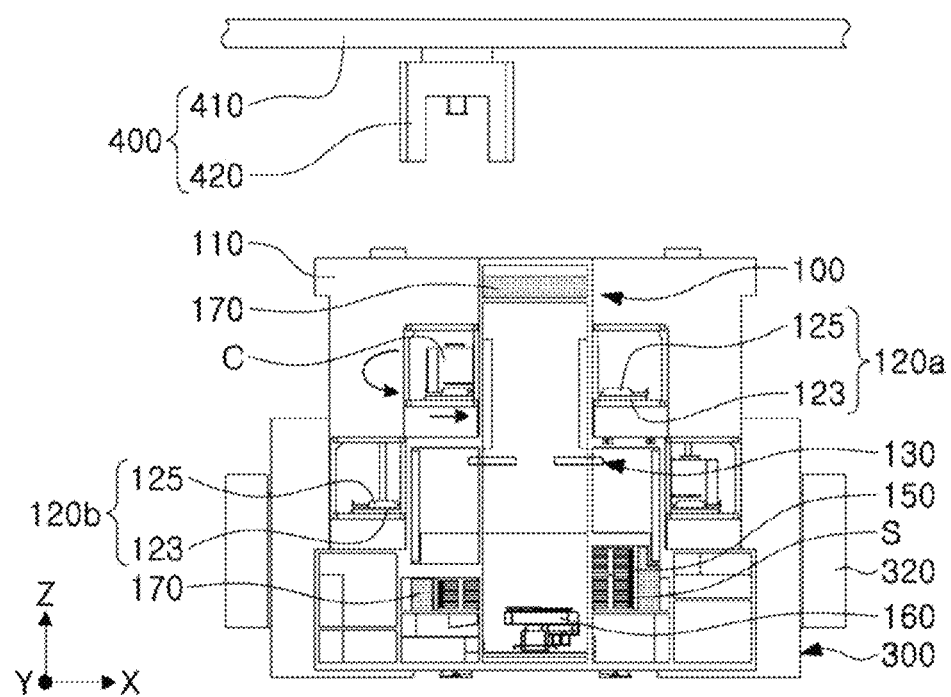

Referring to FIG. 5B, by operating the load ports 120a and 120b on which the substrate carrier C is mounted, the substrate carrier C may be coupled to the chamber 110 of the substrate transfer module 100. For example, the transfer tray 125 supporting the substrate carrier C rotates about 90 degrees about an axis extending in the vertical direction (Z-direction), and moves along the transfer rail 123 in a horizontal direction (e.g., X-direction) to couple the door of the substrate carrier C to the gate of one side of the chamber 110. Thereafter, the gate of the chamber 110 and the door of the substrate carrier C are opened, and the internal space of the substrate carrier C may be connected to the internal space of the chamber 110.

Figure 5C:
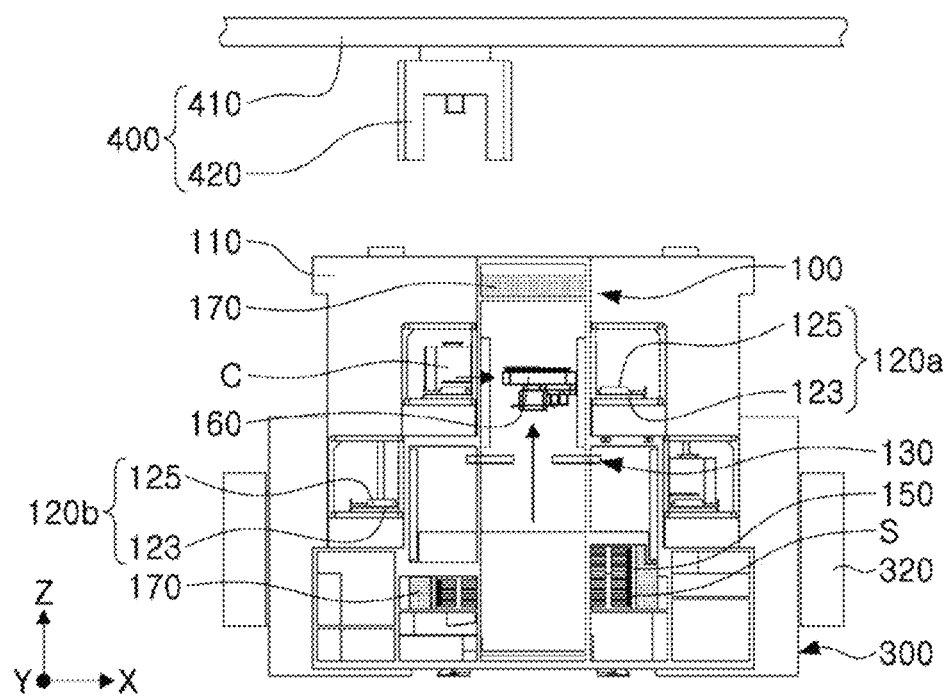

Referring to FIG. 5C, the semiconductor substrate S may be unloaded from the substrate carrier C. For example, the robot arm 160 moves in the vertical direction (Z-direction) to be adjacent to the substrate carrier C and then expands and contracts in the horizontal direction (e.g., the X-direction) to unload the semiconductor substrate S from the substrate carrier C.

Figure 5D:
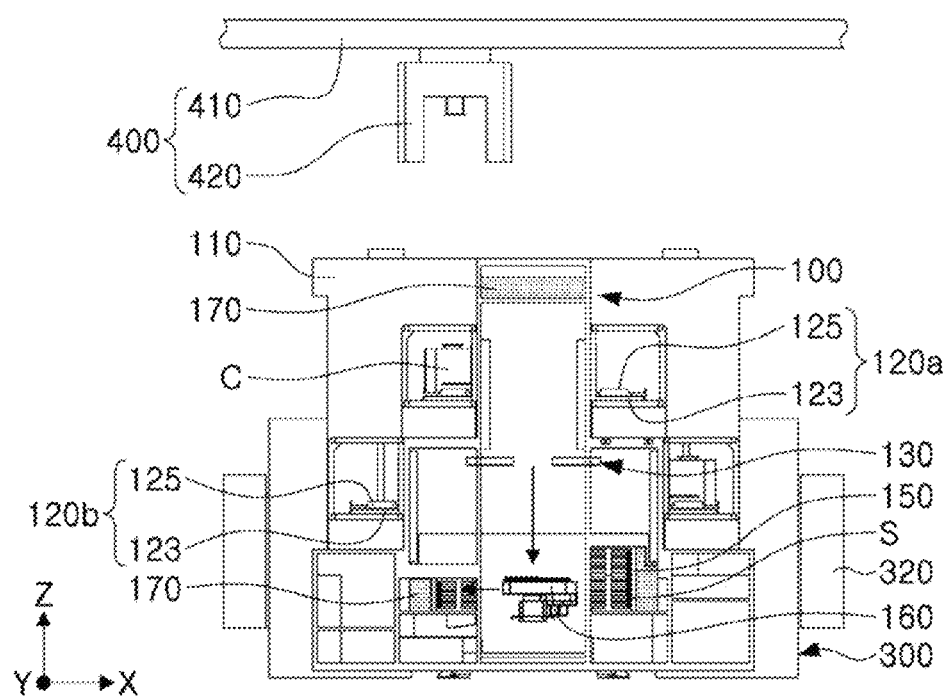

Referring to FIG. 5D, the semiconductor substrate S may be loaded into the substrate aligner 140. For example, the robot arm 160 moves in a vertical direction (Z-direction) to be adjacent to the substrate aligner 140, and then, may expand and contract in a horizontal direction (e.g., X-direction) to load the semiconductor substrate S into the substrate aligner 140. The substrate aligner 140 may sense a notch formed in one side of the semiconductor substrate S, and may rotate the semiconductor substrate S in a preset direction based on the sensed position of the notch. Thereafter, according to some example embodiments, the semiconductor substrate S may be unloaded from the substrate aligner 140 and loaded into the buffer device 150.

Figure 5E:
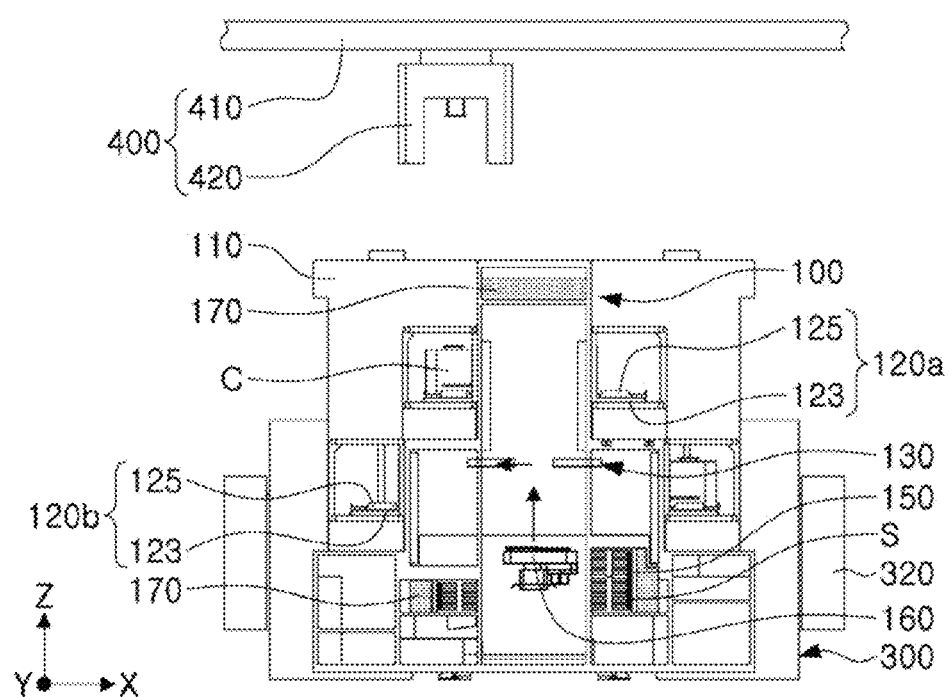

Referring to FIG. 5E, the semiconductor substrate S may be unloaded from the substrate aligner 140 or the buffer device 150 and loaded into the load lock 130. For example, the robot arm 160 holding the semiconductor substrate S moves in the vertical direction (Z-direction) adjacently to the load lock 130, and then expands and contracts in the horizontal direction (e.g., the X-direction) to load the semiconductor substrate S into the load lock 130. To load the semiconductor substrate S, a gate disposed between the load lock 130 and the chamber 110 may be opened and closed. Thereafter, the pressure inside the load lock 130 is controlled to a vacuum pressure, and a transfer arm (refer to '250' of FIG. 1B) of the transfer chamber (refer to '200' of FIG. 1B) may unload the semiconductor substrate S from the load lock 130. To take out the semiconductor substrate S, the gate between the load lock 130 and the transfer chamber 200 may be opened and closed.

Figure 6A:
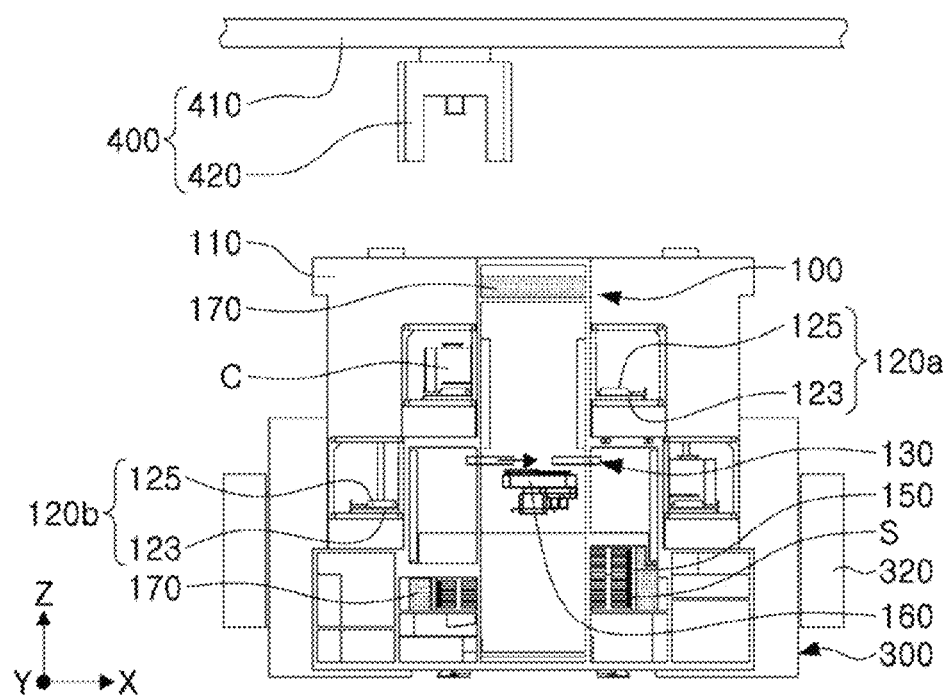
FIGS. 6A, 6B, and 6C are front views illustrating a process of processing a semiconductor substrate using an apparatus for processing a semiconductor substrate according to some example embodiments.
Figure 6B:
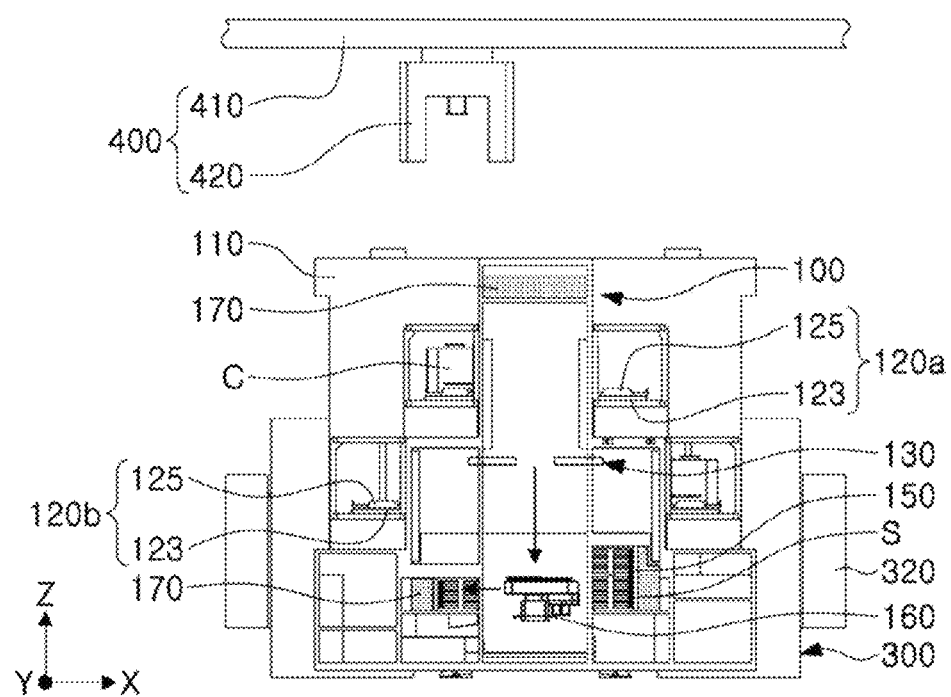
Figure 6C:
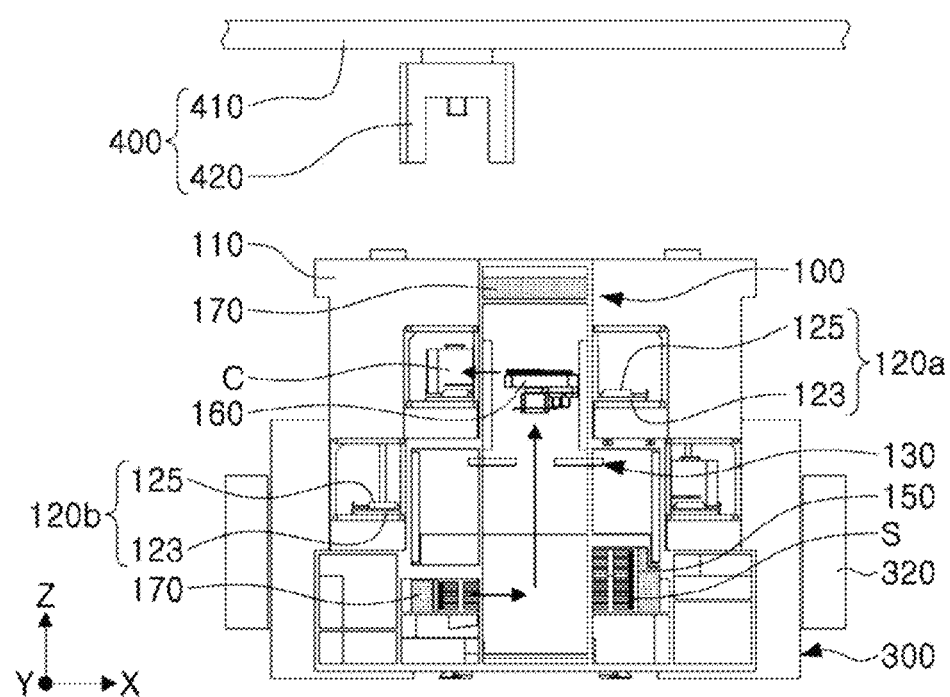

FIGS. 6A to 6C are front views illustrating a process of processing a semiconductor substrate using a semiconductor substrate processing apparatus according to some example embodiments. FIGS. 6A to 6C sequentially illustrate a process of unloading the semiconductor substrate S from the load lock 130 and loading the same into the substrate carrier C.

Referring to FIG. 6A, the semiconductor substrate S on which the process has been completed may be unloaded from the load lock 130. For example, after the robot arm 160 moves in the vertical direction (Z-direction) adjacently to the load lock 130, the semiconductor substrate S may be unloaded from the load lock 130 as the robot arm 160 expands and contracts in the horizontal direction (e.g., the X-direction). In this case, the pressure inside the load lock 130 may be adjusted to atmospheric pressure, which is substantially the same as the pressure in the internal space of the chamber 110. To take out the semiconductor substrate S, a gate disposed between the load lock 130 and the chamber 110 may be opened and closed.

Referring to FIG. 6B, the semiconductor substrate S on which the process has been completed may be loaded into the buffer device 150. For example, after the robot arm 160 holding the semiconductor substrate S having been completed in the process moves in the vertical direction (Z-direction) to be adjacent to the buffer device 150, the semiconductor substrate S may be loaded into the buffer device 150 as the robot arm 160 expands and contracts in the horizontal direction (e.g., the X-direction). The buffer device 150 may temporarily store the semiconductor substrate S on which the process has been completed.

Referring to FIG. 6C, the wafer substrate S may be unloaded from the buffer device 150 and loaded into the substrate carrier C mounted on the load ports 120a and 120b. For example, the robot arm 160 in which the process has been completed moves in the vertical direction (Z-direction) adjacent to the substrate carrier C and then expands and contracts in the horizontal direction (e.g., the X-direction) to load the semiconductor substrate S into the substrate carrier C. When the semiconductor substrate S on which the process has been completed is loaded into the substrate carrier C, the gate of the chamber 110 and the door of the substrate carrier C may be closed. Then, the carrier transfer robot 420 moves in the vertical direction (Z-direction) to pick up the substrate carrier C, and moves in the horizontal direction (the direction in which the X-Y plane extends), to transfer the substrate carrier C to a separate device for subsequent processing.

Figure 7:
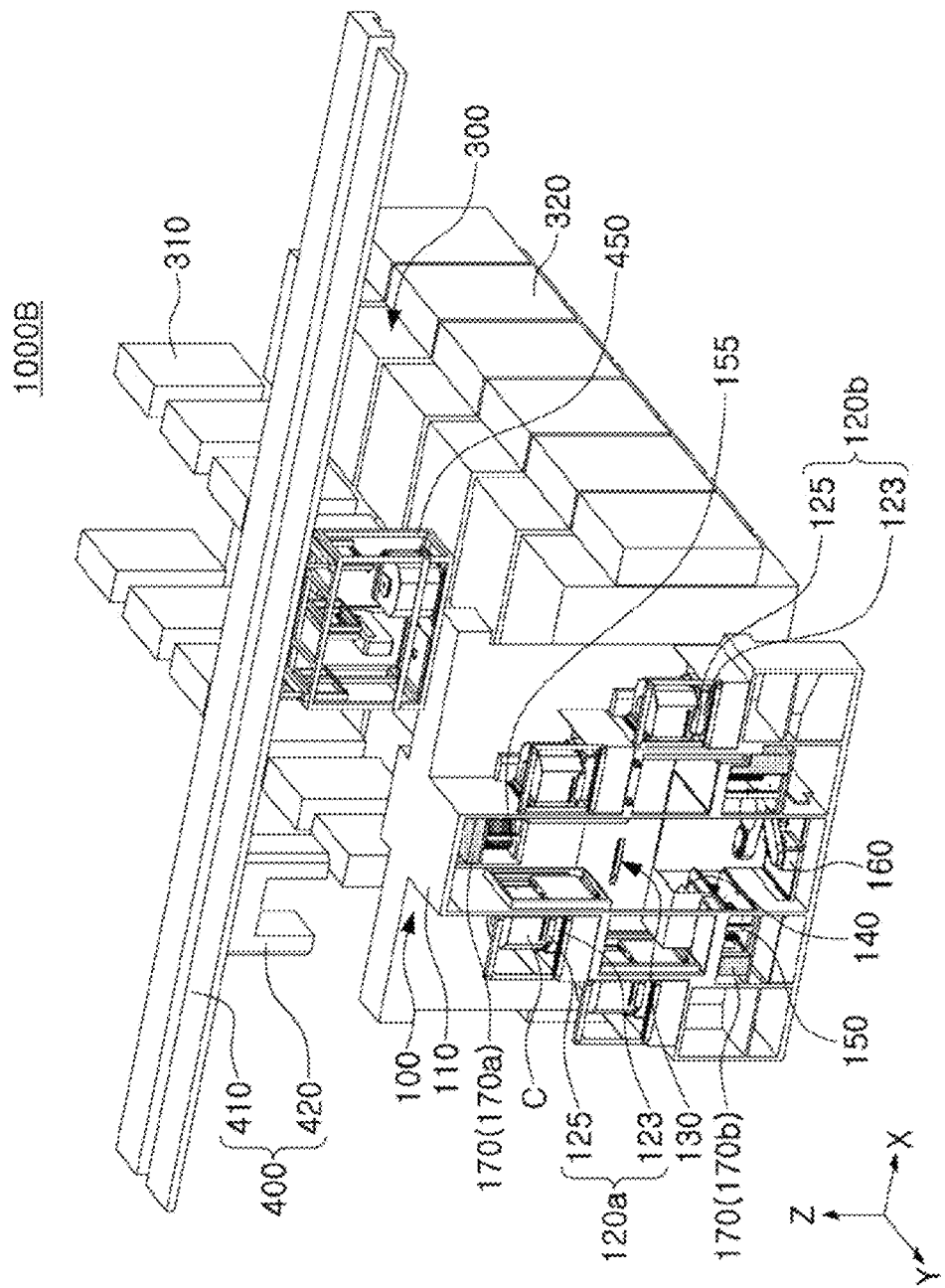
FIG. 7 is a front view illustrating a semiconductor substrate processing apparatus according to some example embodiments.

FIG. 7 is a front view illustrating a semiconductor substrate processing apparatus 1000B according to some example embodiments.

Referring to FIG. 7, a semiconductor substrate processing apparatus 1000B according to some example embodiments has the same or similar characteristics as those described with reference to FIGS. 1A to 6C, except for further including an upper buffer device 155 inside the substrate transfer module 100, and thus, a redundant description will be omitted. The substrate transfer module of some example embodiments may include the upper buffer device 155 disposed in an upper portion of the internal space of the chamber 110 and configured to store the semiconductor substrate S. In addition, a carrier storage device 450 may be disposed on one side of the carrier transfer robot 420. The upper buffer device 155 may be disposed so as not to overlap the movement path of the robot arm 160. For example, the first air supply device 170a and the upper buffer device 155 may be disposed in a recess formed toward the rear side of the chamber 110 (refer to FIG. 7). However, according to some example embodiments, the first air supply device 170a is disposed just above the robot arm 160 similarly to that illustrated in FIG. 1A, and an additional air supply device (not illustrated) may be further disposed on the side or rear surface of the upper buffer device 155. Similar to the buffer device 150 disposed below the load ports 120, the upper buffer device 155 may be configured to store a semiconductor substrate S to be provided for a process or a semiconductor substrate S on which a process has been completed. According to some example embodiments, when the buffer device 150 is saturated with the semiconductor substrate S, an accommodating space of the semiconductor substrate S may be additionally secured. Hereinafter, a process of loading the semiconductor substrate S into the upper buffer device 155 in the semiconductor substrate processing apparatus 1000B of some example embodiments will be described with reference to FIGS. 8A to 8C.

Figure 8A:
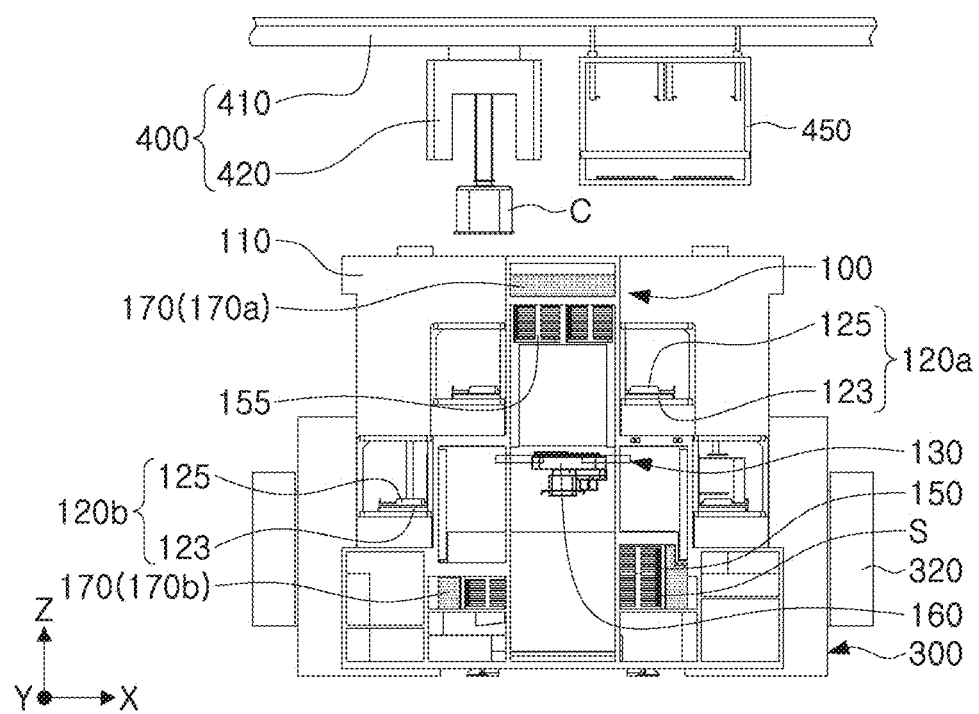
FIGS. 8A, 8B, and 8C are front views illustrating a process of processing a semiconductor substrate using an apparatus for processing a semiconductor substrate according to some example embodiments.
Figure 8B:
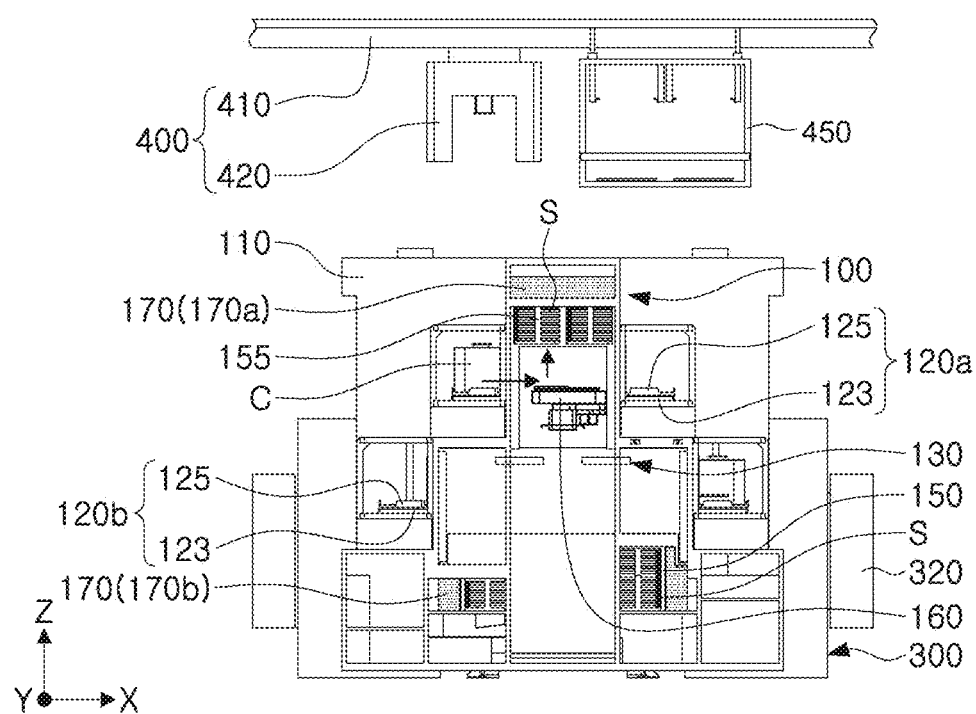
Figure 8C:
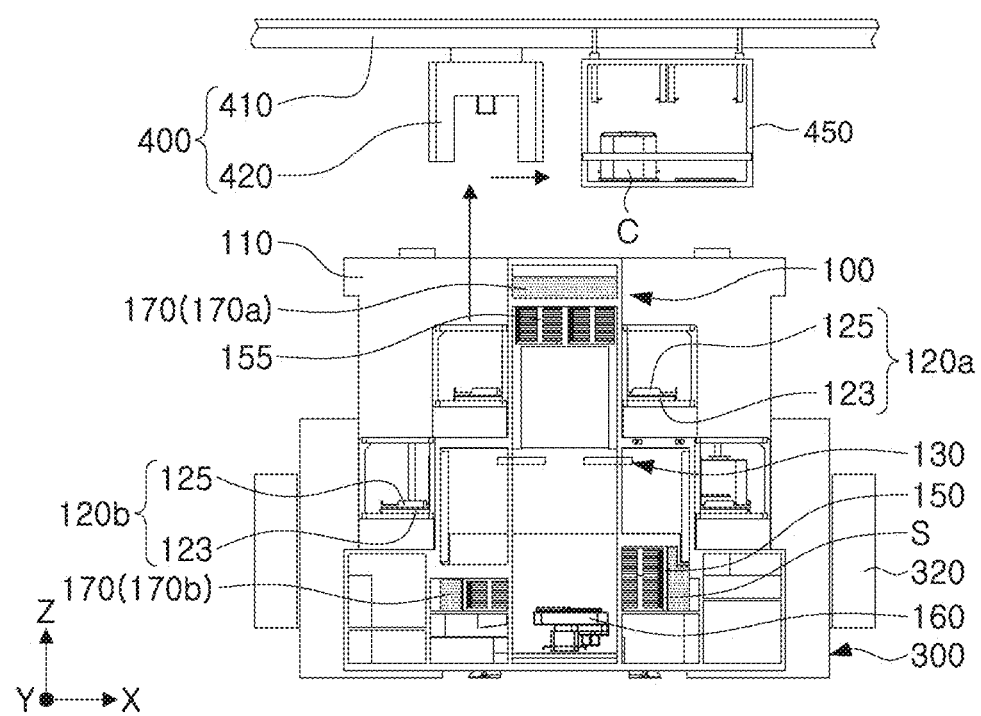

FIGS. 8A to 8C are front views illustrating a process of processing a semiconductor substrate using the semiconductor substrate processing apparatus 1000B of FIG. 7. FIGS. 8A to 8C illustrate a process of loading the semiconductor substrate S into the upper buffer device 155 in order.

Referring to FIG. 8A, the carrier transfer robot 420 moves in the horizontal direction (the direction in which the X-Y plane extends) and the vertical direction (the Z-direction), and the substrate carrier C may be mounted on at least one of the first load port 120a and the second load port 120b. Then, by operating the load ports 120a and 120b on which the substrate carrier C is mounted, the substrate carrier C may be coupled to the chamber 110 of the substrate transfer module 100, and the gate of the chamber 110 and the door of the substrate carrier C may be opened. In addition, a carrier storage device 450 may be disposed on one side of the carrier transfer robot 420.

Referring to FIG. 8B, the semiconductor substrate S may be unloaded from the substrate carrier C and loaded into the upper buffer device 155. For example, after the robot arm 160 moves in the vertical direction (Z-direction) adjacent to the substrate carrier C, the semiconductor substrate S may be unloaded from the substrate carrier C by extending and contracting in the horizontal direction (e.g., the X-direction). Then, after the robot arm 160 moves in the vertical direction (Z-direction) adjacent to the upper buffer device 155, the semiconductor substrate S may be loaded into the upper buffer device 155 by extending and contracting in the horizontal direction (e.g., the X-direction).

Referring to FIG. 8C, the substrate carrier C from which all the semiconductor substrates S are unloaded may be moved to the carrier storage device 450. For example, the carrier transfer robot 420 moves in the vertical direction (Z-direction) to pick up the substrate carrier C, and the substrate carrier C may be moved to the carrier storage device 450 by moving in the horizontal direction (the direction in which the X-Y plane extends). The carrier storage device 450 may temporarily store the substrate carrier C from which all the semiconductor substrates S are unloaded. Thereafter, in order to take out the semiconductor substrate S on which the process is completed, the carrier transfer robot 420 may provide the substrate carrier C stored in the carrier storage device 450 to the substrate transfer module 100.

Figure 9A:
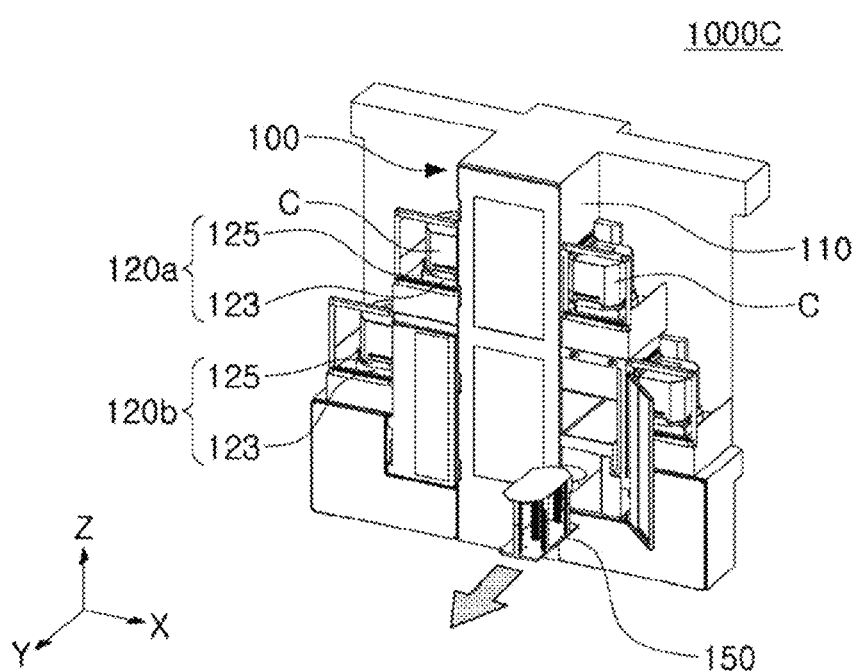
FIGS. 9A and 9B are perspective views illustrating a semiconductor substrate processing apparatus according to some example embodiments.
Figure 9B:
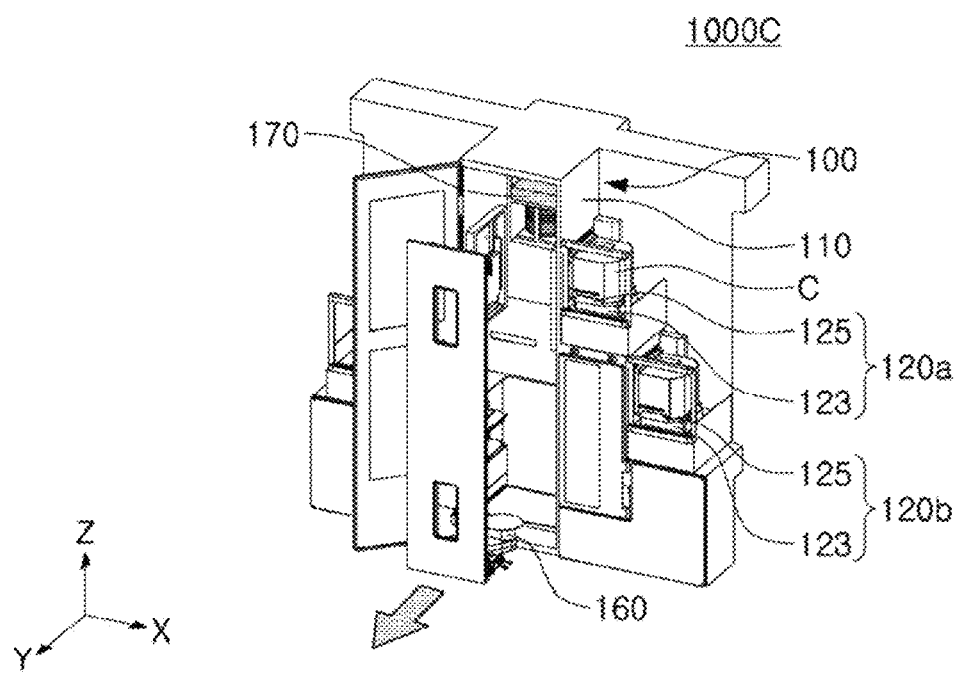

FIGS. 9A and 9B are perspective views illustrating a semiconductor substrate processing apparatus 1000C according to some example embodiments.

Referring to FIGS. 9A and 9B, in the semiconductor substrate processing apparatus 1000C according to some example embodiments, an entrance for loading and unloading the buffer device 150 and the robot arm 160 may be formed on the front surface of the chamber 110. According to some example embodiments, at least a pair of load ports 120 are disposed to face each other in the X-direction on both sides of the chamber 110 rather than the front surface (e.g., Y-direction) of the chamber 110, and thus, processing efficiency of the semiconductor substrate processing apparatus 1000C per unit area may be improved. Accordingly, the substrate transfer module 100 may be configured to maintain the elements inside the chamber 110 through the front surface (e.g., Y-direction) of the chamber 110. For example, the buffer device 150 and the robot arm 160 may be installed to slide through the front surface (e.g., Y-direction) of the chamber 110. In addition, the substrate transfer module 100 of some example embodiments may further include at least one front door configured to open and close the entrance and exit of the buffer device 150 and the robot arm 160.

As set forth above, according to some example embodiments, by significantly reducing the installation area of the substrate transfer module, a semiconductor substrate processing apparatus having improved processing efficiency per unit area may be provided. While some example embodiments have been illustrated and described above, it will be apparent to those skilled in the art that modifications and variations could be made without departing from the scope of the present inventive concepts as defined by the appended claims.

What is claimed is:

1. A semiconductor substrate processing apparatus, comprising:
   a substrate transfer module, the substrate transfer module including
      a chamber having one or more inner surfaces at least partially defining an internal space extending in a first direction within the chamber,
      at least one pair of first load ports at opposite sides of the chamber, the at least one pair of load ports facing in a second direction and configured to rotate and move a substrate carrier to couple the substrate carrier accommodating a semiconductor substrate to the chamber, the second direction intersecting the first direction,
      a load lock at a rear surface of the chamber to be connected to the internal space of the chamber, and
      a robot arm configured to move in the first direction in the internal space of the chamber to
         unload the semiconductor substrate from the substrate carrier and load the semiconductor substrate into the load lock, or
         unload the semiconductor substrate from the load lock and load the semiconductor substrate into the substrate carrier;
   a transfer chamber connected to the load lock of the substrate transfer module;
   a plurality of processing chambers connected to the transfer chamber; and
   a transfer arm inside the transfer chamber, the transfer arm configured to unload the semiconductor substrate from the load lock, and
      load the semiconductor substrate into at least one processing chamber of the plurality of processing chambers,
      wherein the load lock is configured to connect the transfer chamber to the internal space of the chamber in a third direction, and
      wherein the first direction, the second direction, and the third direction are perpendicular to each other.

2. The semiconductor substrate processing apparatus of claim 1, wherein the at least one pair of first load ports overlap at least a portion of the chamber in the first direction.

3. The semiconductor substrate processing apparatus of claim 1, wherein the at least one pair of first load ports include a transfer rail extending toward the chamber, and a transfer tray configured to move along the transfer rail and configured to rotate about a rotation axis extending in the first direction.

4. The semiconductor substrate processing apparatus of claim 3, wherein the at least one pair of first load ports are configured to couple the substrate carrier mounted on the transfer tray to the chamber.

5. The semiconductor substrate processing apparatus of claim 1, wherein the substrate transfer module further includes a first air supply device in an upper portion of the internal space and configured to supply air to the internal space.

6. The semiconductor substrate processing apparatus of claim 1, wherein the substrate transfer module further includes a substrate aligner on a side of the internal space to overlap with at least one of the at least one pair of first load ports in the first direction, the substrate aligner configured to align the semiconductor substrate.

7. The semiconductor substrate processing apparatus of claim 1, wherein the substrate transfer module further includes a buffer device on a side of the internal space to overlap with at least one of the at least one pair of first load ports in the first direction, the buffer device configured to store the semiconductor substrate.

8. The semiconductor substrate processing apparatus of claim 7, wherein the substrate transfer module further includes a second air supply device on one side of the buffer device and configured to supply air to the internal space.

9. The semiconductor substrate processing apparatus of claim 1, wherein the load lock is configured to receive the semiconductor substrate, based on the semiconductor substrate being transferred from the substrate transfer module to the transfer chamber or transferred from the transfer chamber to the substrate transfer module.

10. The semiconductor substrate processing apparatus of claim 9, wherein the load lock includes one or more inner surfaces at least partially defining an internal region inside the load lock, the load lock is configured to accommodate the semiconductor substrate within the internal region, and the load lock is configured to control a pressure of the internal region.

11. The semiconductor substrate processing apparatus of claim 1, wherein the substrate transfer module further includes at least one pair of second load ports on the opposite sides of the chamber so such that the at least one pair of second load ports do not overlap the at least one pair of first load ports in the first direction.

12. The semiconductor substrate processing apparatus of claim 1, wherein the substrate transfer module further includes an upper buffer device in an upper portion of the internal space and configured to store the semiconductor substrate.

13. A semiconductor substrate processing apparatus, comprising:
a substrate transfer module, the substrate transfer module including
a chamber having one or more inner surfaces at least partially defining an internal space extending in a first direction within the chamber,
at least one pair of load ports at opposite sides of the chamber, the at least one pair of load ports facing in a second direction, intersecting the first direction,
at least one pair of substrate aligners and at least one pair of buffer devices on opposite side portions of the internal space to overlap the at least one pair of load ports in the first direction, and
a robot arm configured to move in the first direction in the internal space of the chamber and configured to transfer a semiconductor substrate to the at least one pair of load ports, the at least one pair of substrate aligners and the at least one pair of buffer devices;
a transfer chamber connected to the substrate transfer module;

a plurality of processing chambers connected to the transfer chamber; and
a transfer arm inside the transfer chamber and configured to load the semiconductor substrate into at least one of the plurality of processing chambers.

14. The semiconductor substrate processing apparatus of claim 13, wherein the substrate transfer module further includes a load lock connecting the chamber and the transfer chamber.

15. The semiconductor substrate processing apparatus of claim 14, wherein the robot arm is configured to load the semiconductor substrate into the load lock based on the semiconductor substrate being unloaded from the at least one pair of buffer devices, or to load the semiconductor substrate into the at least one pair of buffer devices based on the semiconductor substrate being unloaded from the load lock.

16. The semiconductor substrate processing apparatus of claim 13, wherein the at least one pair of load ports include a transfer tray configured to rotate a substrate carrier about a rotation axis extending in the first direction to connect the substrate carrier accommodating the semiconductor substrate to the chamber.

17. The semiconductor substrate processing apparatus of claim 16, wherein the at least one pair of load ports are configured to rotate the substrate carrier such that a door of the substrate carrier faces the chamber.

18. A semiconductor substrate processing apparatus, comprising:
a substrate transfer module, the substrate transfer module including
a chamber having a front surface and a rear surface opposing each other,
at least one pair of load ports at opposite sides of the chamber,
at least one pair of buffer devices in the chamber to overlap the at least one pair of load ports in a vertical direction,
a load lock on the rear surface of the chamber, and
a robot arm configured to move in the vertical direction in the chamber and configured to transfer a semiconductor substrate to the at least one pair of load ports, the at least one pair of buffer devices, and the load lock,
wherein the front surface of the chamber includes an entrance configured to enable the robot arm and the at least one pair of buffer devices to be loaded and unloaded through the entrance.

19. The semiconductor substrate processing apparatus of claim 18, wherein the robot arm and the at least one pair of buffer devices are installed in the chamber and are configured to slide through the entrance.

20. The semiconductor substrate processing apparatus of claim 18, wherein the substrate transfer module further includes at least one front door configured to open and close the entrance.

* * * * *